United States Patent
Johansson et al.

(10) Patent No.: US 6,911,368 B2
(45) Date of Patent: Jun. 28, 2005

(54) ARRANGEMENT FOR PREVENTING SHORT-CIRCUITING IN A BIPOLAR DOUBLE-POLY TRANSISTOR AND A METHOD OF FABRICATING SUCH AN ARRANGEMENT

(75) Inventors: Ted Johansson, Djursholm (SE); Hans Norström, Solna (SE); Anders Lindgren, Sollentuna (SE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/893,604

(22) Filed: Jul. 16, 2004

(65) Prior Publication Data

US 2005/0003623 A1 Jan. 6, 2005

Related U.S. Application Data

(63) Continuation of application No. PCT/SE02/02212, filed on Dec. 2, 2002.

(30) Foreign Application Priority Data

Jan. 21, 2002 (SE) .............................................. 0200177

(51) Int. Cl.⁷ ............................................ H01L 21/331
(52) U.S. Cl. ...................... 438/309; 438/350; 438/366; 257/565; 257/587; 257/592

(58) Field of Search .................................. 438/309, 350, 438/365, 366; 257/565, 587, 588, 592

(56) References Cited

U.S. PATENT DOCUMENTS

| 6,156,594 | A | * | 12/2000 | Gris | 438/202 |
| 6,323,104 | B1 | * | 11/2001 | Trivedi | 438/424 |
| 6,376,322 | B1 | | 4/2002 | Gris | 438/309 |
| 2001/0012655 | A1 | | 8/2001 | Nordstrom et al. | 438/239 |

FOREIGN PATENT DOCUMENTS

| EP | 0 949 666 A1 | | 3/1999 | ......... H01L/21/331 |
| JP | 06-275633 | * | 9/1994 | |
| JP | 2000269233 | | 9/2000 | ......... H01L/21/331 |

* cited by examiner

Primary Examiner—Trung Dang
(74) Attorney, Agent, or Firm—Baker Botts L.L.P.

(57) ABSTRACT

In a bipolar double-poly transistor comprising a layer of base silicon (1') on a silicon substrate (2'), a first layer of silicon dioxide (3') on the base silicon layer (1'), an emitter window (4') extending through the first layer (3') of silicon dioxide and the base silicon layer (1'), a second layer (5') of silicon dioxide in the emitter window (4'), silicon nitride spacers (6') on the second layer (5') of silicon dioxide in the emitter window (4'), and emitter silicon (9') in the emitter window (4'), an isolating silicon nitride seal is provided to separate the base silicon (1') from the emitter silicon (9') to prevent short-circuiting between the base silicon (1') and the emitter silicon (9') in the transistor.

5 Claims, 8 Drawing Sheets

ARRANGEMENT FOR PREVENTING SHORT-CIRCUITING IN A BIPOLAR DOUBLE-POLY TRANSISTOR AND A METHOD OF FABRICATING SUCH AN ARRANGEMENT

CROSS REFERENCE TO RELATED APPLICATION

This application is a continuation of copending International Application No. PCT/SE02/02212 filed Dec. 2, 2002 which designates the United States, and claims priority to Swedish application no. 0200177-4 filed Jan. 21, 2002.

TECHNICAL FIELD OF THE INVENTION

The invention relates generally to bipolar double-poly transistors and more specifically to an arrangement for preventing short-circuiting between base silicon and emitter silicon in such transistors as well as to a method of fabricating such an arrangement.

BACKGROUND OF THE INVENTION

FIGS. 1–3 on the appended drawing illustrate different steps of a known method of fabricating an emitter-base portion of a bipolar double-poly transistor, such as described in US 2001/0012655A1.

It should be noted that only half of the emitter window of the transistor structure is shown.

In a manner known per se, the transistor structure illustrated in FIG. 1 comprises a layer 1 of base silicon that has been deposited on a silicon substrate 2, and a layer 3 of silicon dioxide that has been deposited on the base silicon layer 1.

An etched-out emitter window 4 extends through the silicon dioxide layer 3 and the base silicon layer 1 down into an etched-out portion of the silicon substrate 2.

Also in a manner known per se, a layer 5 of silicon dioxide has been formed, e. g. thermally grown, in the emitter window 4. The silicon dioxide layer 5 covers the walls of the emitter window 4 and the bottom of the emitter window 4, i. e. the etched-out portion of the silicon substrate 2.

Moreover, in a manner known per se, silicon nitride spacers 6, only one of which is shown in FIG. 1, have been formed on the silicon dioxide layer 5 in the emitter window 4, e. g. by deposition of silicon nitride and reactive ion etching.

In FIG. 2, the part of the silicon dioxide layer 5 that is not covered by the spacer 6 at the bottom of the emitter window 4 has been etched away, e. g. by a wet-etching procedure using hydrofluoric acid in a bath or vapor. However, also part of the silicon dioxide layer 5 that lies under the spacer 6 at the bottom of the emitter window 4 will be etched away as indicated by 7.

In the same wet-etching step, part of the silicon dioxide layer 3 facing the emitter window 4 is etched away as well as part of the silicon dioxide layer 5 between the base silicon layer 1 and the spacer 6. Thus, a narrow slot 8 is formed, that extends down between the base silicon layer 1 and the spacer 6.

After cleaning of exposed silicon surfaces, which includes removal of native silicon dioxide by exposure to hydrofluoric acid in a bath or vapor, emitter silicon 9 is deposited into the emitter window 4. The emitter silicon 9 that is deposited into the emitter window 4 will fill the slot 8 and hereby come into direct contact with the base silicon layer 1 as indicated within an encircled area 10 in FIG. 3.

Thus, the emitter silicon 9 will be short-circuited to the base silicon layer 1 making the transistor inoperative.

It would of course be possible to etch away the part of the silicon dioxide layer 5 that is not covered by the spacer 6 at the bottom of the emitter window 4 in FIG. 2 by a dry-etching procedure. Hereby, the slot 8 would not be formed. However, when the silicon surfaces are exposed to hydrofluoric acid in a bath or vapor to remove native silicon dioxide as a part of a cleaning step immediately prior to emitter silicon deposition, the slot 8 will be formed. This cleaning step cannot be carried out by a dry-etch process but has to be carried out by exposing the silicon surfaces to hydrofluoric acid.

SUMMARY OF THE INVENTION

The object of the invention is to prevent short-circuiting of the emitter silicon and the base silicon in bipolar double-poly transistors.

This is attained according to the invention in that an isolating silicon nitride seal is provided to separate the base silicon from the emitter silicon.

A method in the fabrication of an emitter-base portion of a bipolar double-poly transistor, may, thus, comprise the steps of a) depositing a layer of base silicon on a silicon substrate and doping it, b) depositing a first layer of silicon dioxide on the base silicon layer, c) etching an emitter window through the first layer of silicon dioxide and the base silicon layer, d) forming a second layer of silicon dioxide in the emitter window, e) forming silicon nitride spacers on the second layer of silicon dioxide in the emitter window by deposition of silicon nitride and reactive ion etching, f) removing the second layer of silicon dioxide from the bottom of the emitter window, and g) depositing emitter silicon in the emitter window, characterized by providing a silicon nitride seal isolating the base silicon from the emitter silicon.

The method may provide the silicon nitride seal after step c) by forming a notch in the emitter window wall between the first layer of silicon dioxide and the layer of base silicon, forming the second layer of silicon dioxide in the notch in step d), and filling the notch with the layer of silicon nitride deposited in step e). The method may form the notch by exposing at least the emitter window wall to anhydrous hydrofluoric vapor. The method may provide the silicon nitride seal after step a) by depositing a thin layer of silicon nitride on the layer of base silicon before the first layer of silicon dioxide is deposited in step b). The method may deposit a thin silicon dioxide on the layer of base silicon before the layer of silicon nitride is deposited.

A bipolar double-poly transistor may, thus, comprise a layer of base silicon on a silicon substrate, a first layer of silicon dioxide on the base silicon layer, an emitter window extending through the first layer of silicon dioxide and the base silicon layer, a second layer of silicon dioxide in the emitter window, silicon nitride spacers on the second layer of silicon dioxide in the emitter window, and emitter silicon in the emitter window, an arrangement for preventing short-circuiting between the base silicon and the emitter silicon in the transistor, characterized in that an isolating silicon nitride seal is provided to separate the base silicon from the emitter silicon.

The isolating silicon nitride seal may comprise a notch in the emitter window wall between the first layer of silicon dioxide and the layer of base silicon, the second layer of silicon dioxide being provided on the first layer of silicon dioxide and the layer of base silicon in the notch, and silicon nitride filling out the notch. The isolating silicon nitride seal may comprise a thin layer of silicon nitride between the layer of base silicon and the first layer of silicon dioxide. The arrangement may comprise a thin layer of silicon dioxide between the layer of silicon nitride and the layer of base silicon.

BRIEF DESCRIPTION OF THE DRAWING

The invention will be described more in detail below with reference to the appended drawing on which.

DESCRIPTION OF THE INVENTION

Figure 4:
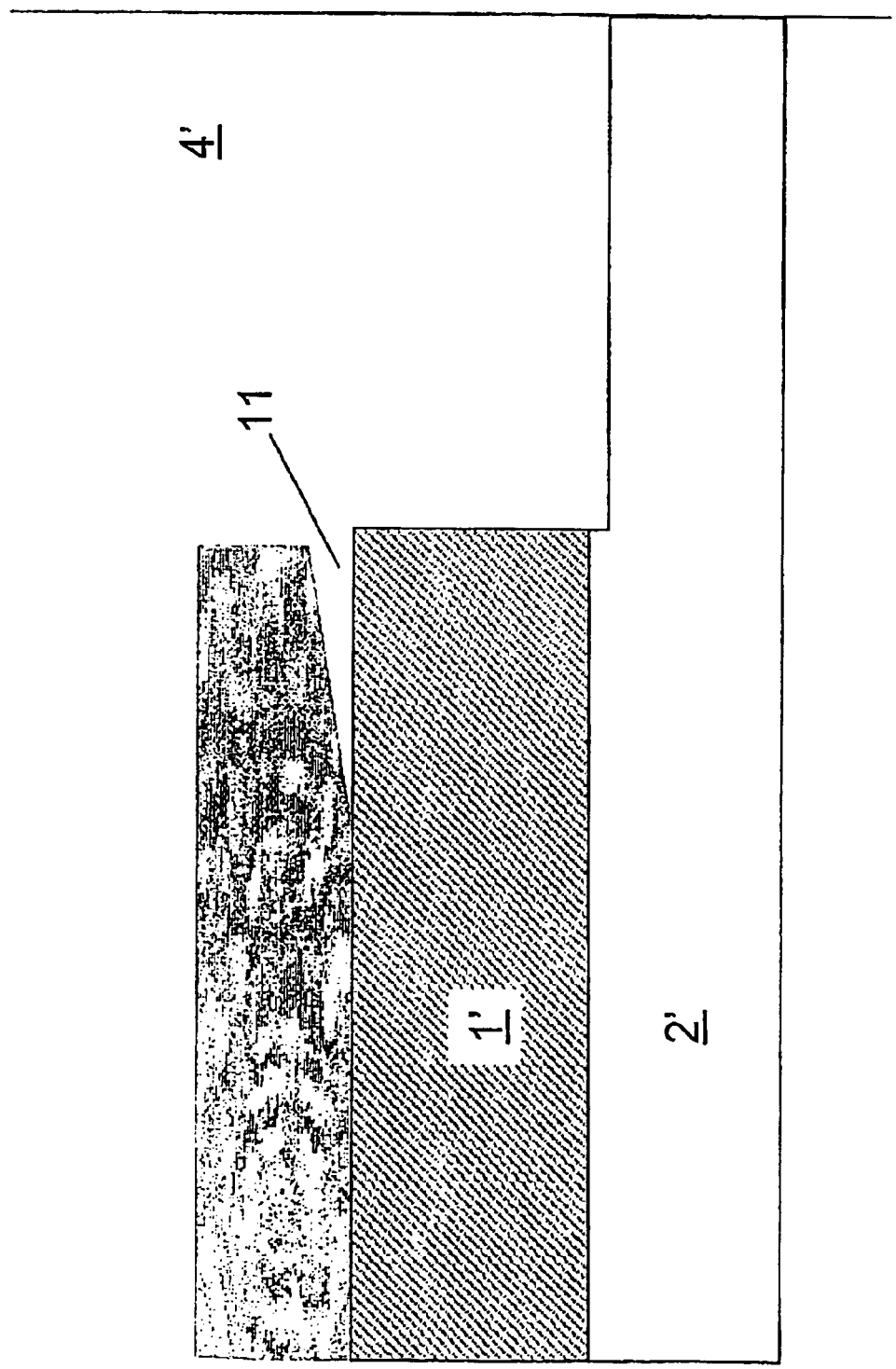
FIGS. 4–6 illustrate different steps of a first embodiment of a method according to the invention of fabricating an emitter-base portion of a bipolar double-poly transistor.
Figure 5:
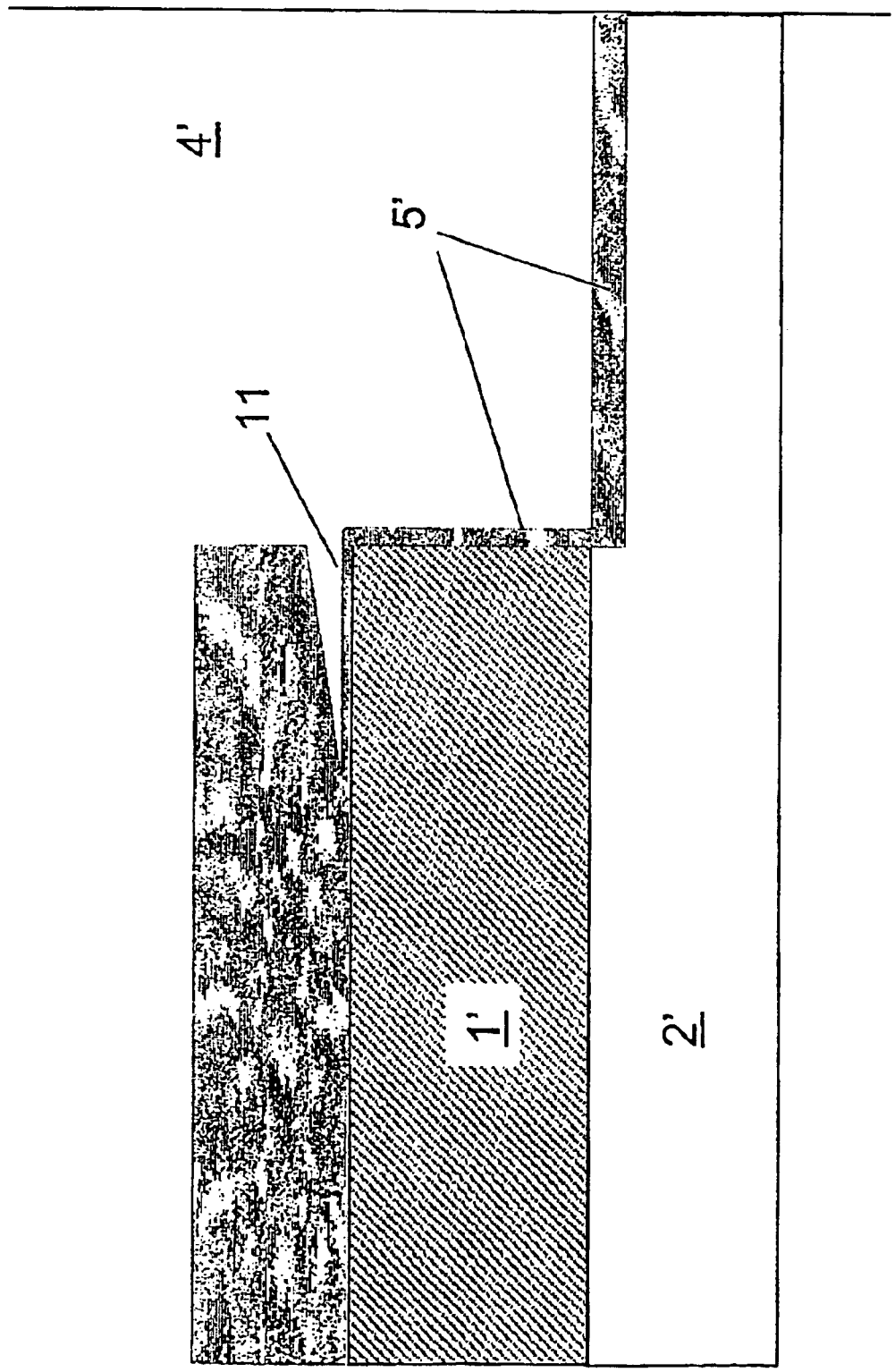
Figure 6:
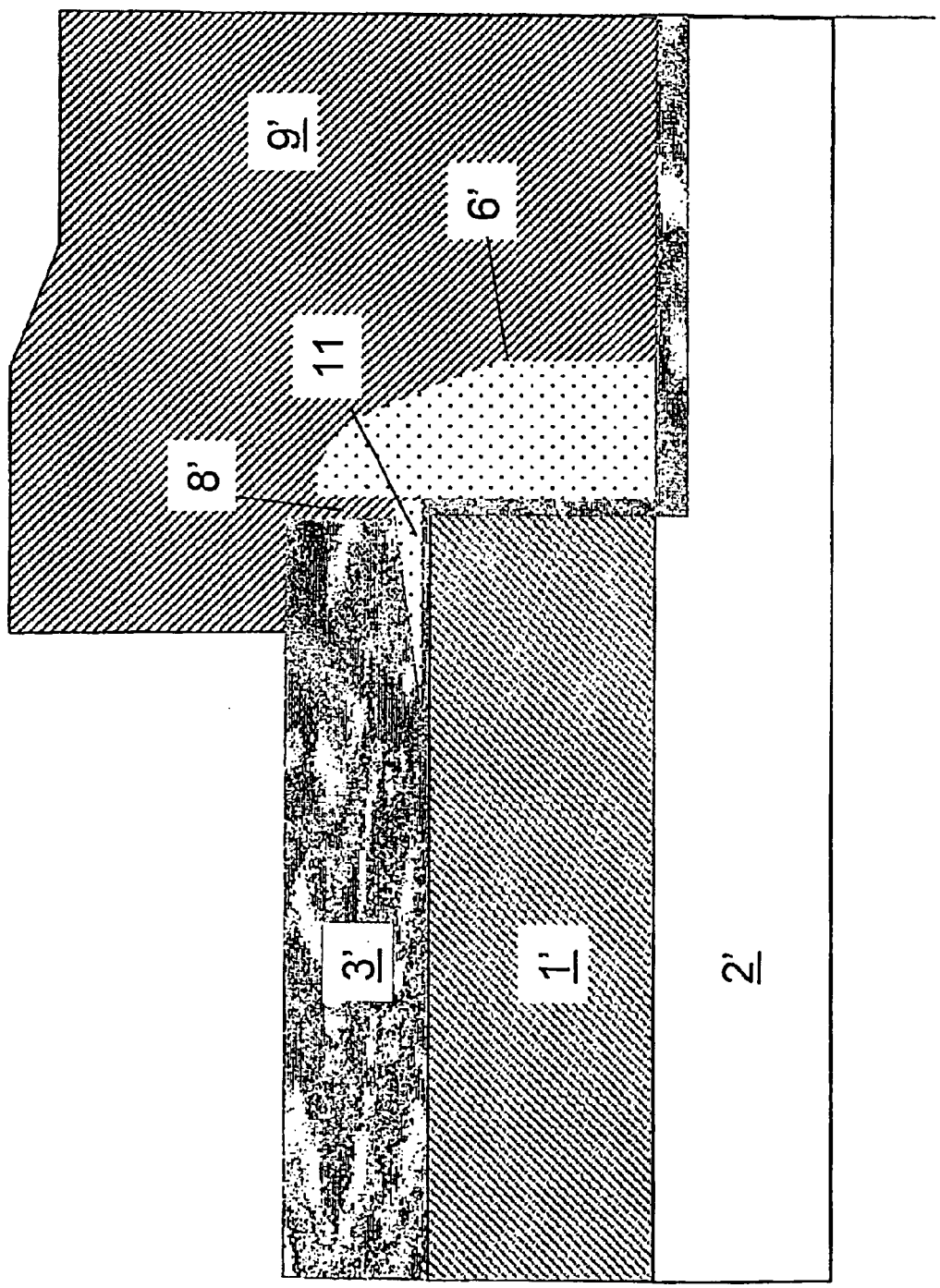

FIGS. 4–6 illustrate different steps of a first embodiment of a method according to the invention of fabricating an emitter-base portion of a bipolar double-poly transistor In FIG. 4, an emitter window 4' has been dry etched out through a deposited silicon dioxide layer 3' and a base silicon layer 1' down into an etched-out portion of a silicon substrate 2'. It should, however, be understood that it is not absolutely necessary to etch out a portion of the silicon substrate 2'.

In accordance with the invention, before the photo-resist mask (not shown) that is used in the emitter window etching step is removed, a notch 11 is formed in the emitter window wall between the silicon dioxide layer 3' and the base silicon layer 1'.

The notch 11 is formed by exposing the transistor structure including the resist mask (not shown) on top of the silicon dioxide layer 3' to anhydrous hydrofluoric vapor. The deposited silicon dioxide layer 3' is porous and has a high etch rate. The notch 11 is formed due to the fact that the etch rate is higher along the interface between the silicon dioxide layer 3' and the base silicon layer 1'. The portion of the silicon dioxide layer 3' that forms part of the side wall of the emitter window 4', is covered by a thin polymer arising from the dry etch and will be etched to a much lesser extent. The upper surface of the silicon dioxide layer 3' will be unaffected due to the presence of the photo-resist mask.

Figure 1:
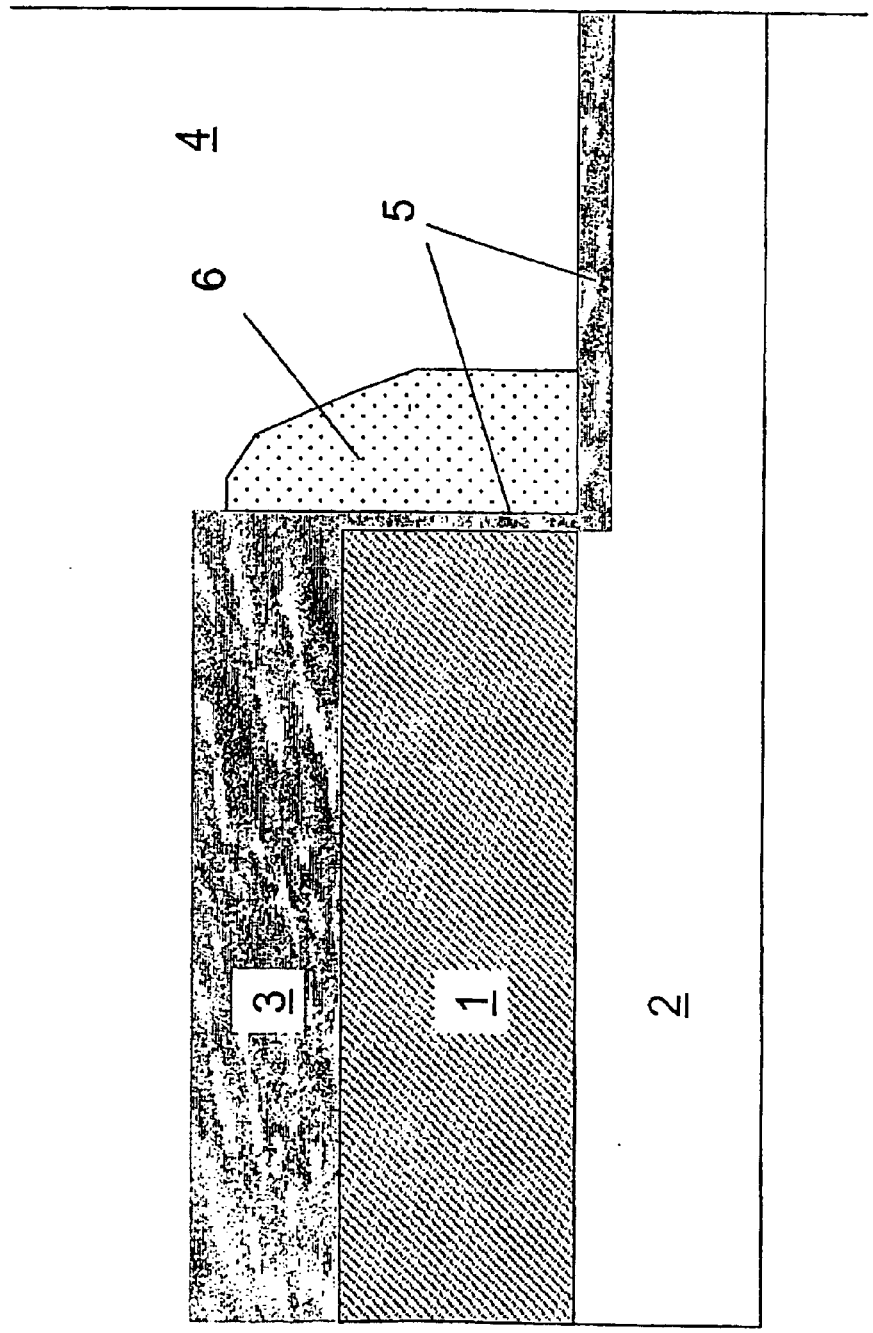
FIGS. 1–3 described above, illustrate different steps of a known method of fabricating an emitter-base portion of a bipolar double-poly transistor.

In FIG. 5, as described above in connection with FIG. 1, a thin layer 5' of silicon dioxide, typically 200 Å, has been formed, e. g. grown, in the emitter window 4'. The silicon dioxide layer 5' covers the walls of the emitter window 4' including the walls of the notch 11 and the bottom of the emitter window 4', i. e. the etched-out portion of the silicon substrate 2' in this embodiment.

In the same manner as described above in connection with FIG. 1, after that the layer 5' of silicon dioxide has been formed in the emitter window 4', silicon nitride spacers 6', only one of which is shown in FIG. 6, are formed on the silicon dioxide layer 5' in the emitter window 4', e. g. by deposition of silicon nitride and reactive ion etching.

When the silicon nitride for the spacer 6' is deposited in the emitter window 4', the silicon nitride will fill out the notch 11 as illustrated in FIG. 6.

After that the spacer 6' has been formed, the layer 5' of silicon dioxide at the bottom of the emitter window 4' is etched away in the same manner as described above in connection with FIG. 2. During this process, a narrow slot 8' may be formed between the spacer 6' and the silicon dioxide layer 3' as indicated in FIG. 6.

Then, after cleaning of exposed silicon surfaces, which includes removal of native, silicon dioxide by exposure to hydrofluoric acid in a bath or vapor, emitter silicon 9' is deposited into the emitter window 4' as shown in FIG. 6.

The silicon nitride filled notch 11 that is integral with the spacer 6' will act as a seal that efficiently isolates the base silicon 1' from the emitter silicon 9' as apparent from FIG. 6.

Figure 7:
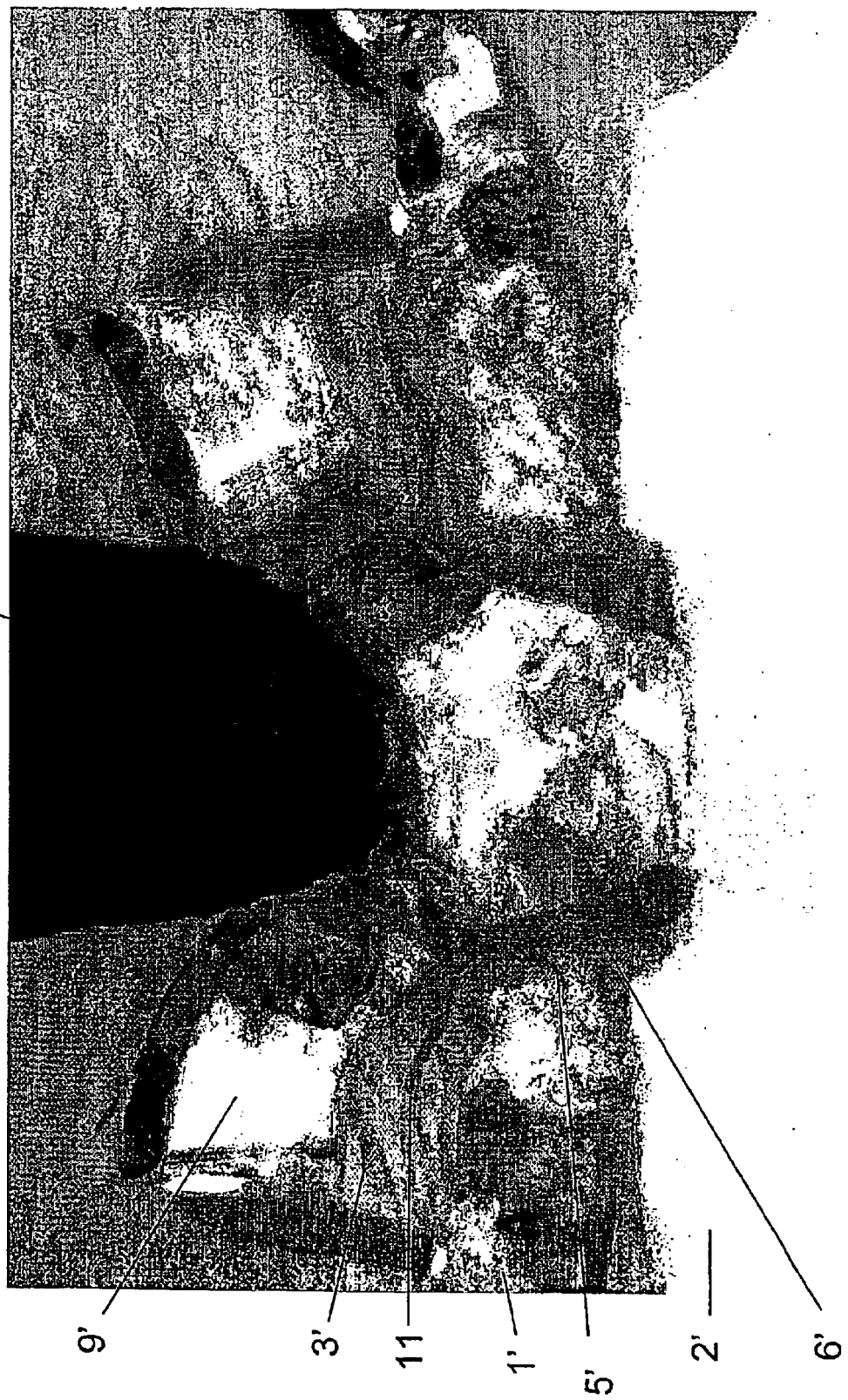
FIG. 7 is a transmission electron micrograph of a cross-section through a full bipolar double-poly transistor fabricated in accordance with the first embodiment of the method according to the invention.

FIG. 7 is a transmission electron micrograph of a cross-section through a full bipolar double-poly npn transistor fabricated in accordance with the embodiment of the method according to the invention described above in connection with FIGS. 4–6.

In FIG. 7, the same reference numerals as used in FIGS. 4–6 have been inserted.

Thus, the wing-like structure 11 is the silicon nitride filled notch.

13 denotes an emitter metal contact.

Figure 8:
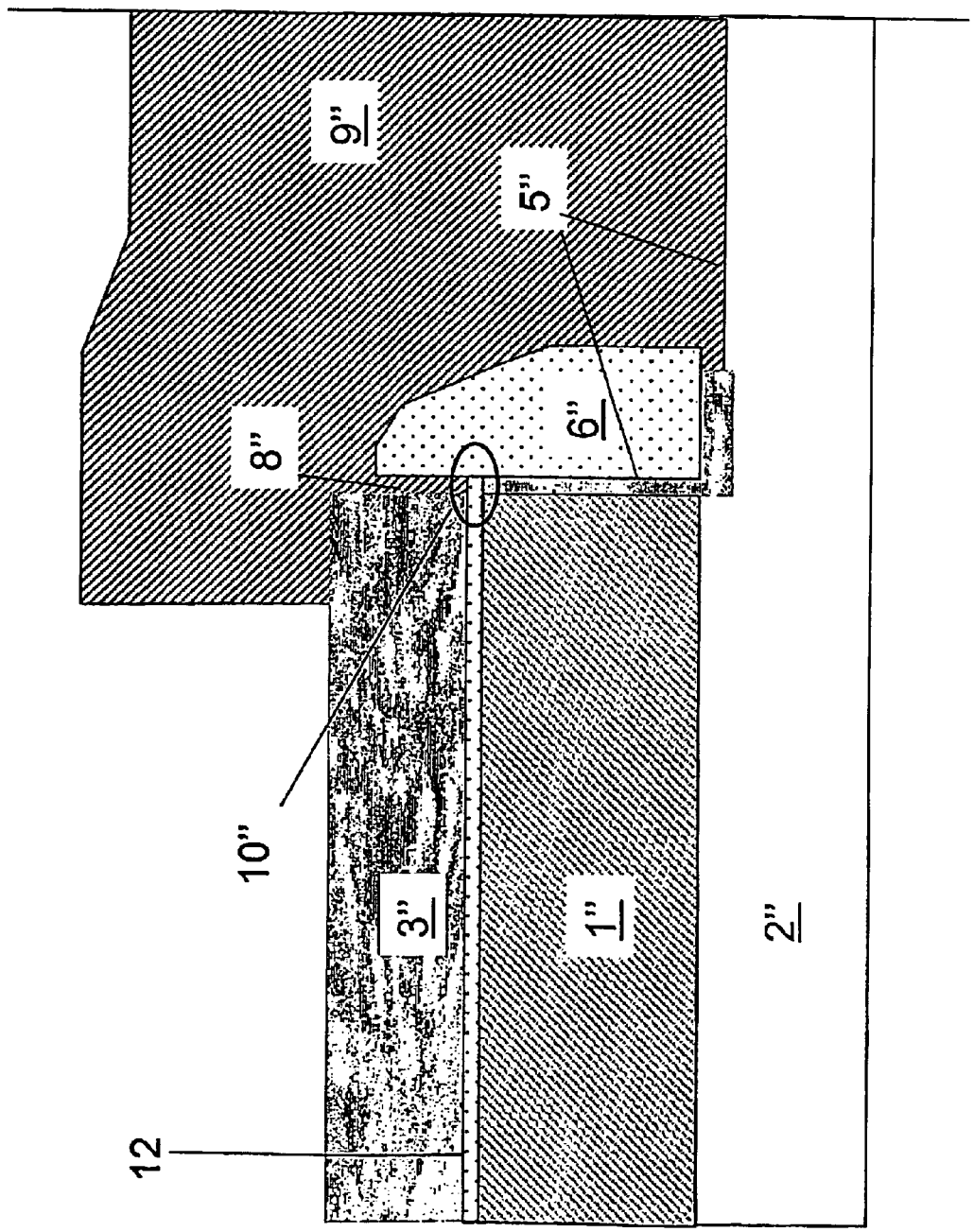
FIG. 8 illustrates a second embodiment of a method according to the invention of fabricating an emitter-base portion of a bipolar double-poly transistor.

With reference to FIG. 8, a second embodiment of the invention for providing a silicon nitride seal to isolate the base silicon from the emitter silicon will be described.

The transistor structure illustrated in FIG. 8 comprises a layer 1" of base silicon that has been deposited on a silicon substrate 2".

In accordance with the invention, a thin layer 12 of silicon nitride has been deposited on the base silicon layer 1". Then, a layer 3" of silicon dioxide has been deposited on the silicon nitride layer 12. The thin silicon nitride layer 12 must not necessarily be deposited directly on the base silicon layer 1" but can be deposited on a thin silicon dioxide (not shown), known as pad oxide, on the base silicon layer 1'.

An etched-out emitter window extends through the silicon dioxide layer 3", the silicon nitride layer 12, and the base silicon layer 1" down into an etched-out portion of the silicon substrate 2".

A thin layer 5" of silicon dioxide has been formed in the emitter window and silicon nitride spacers 6", only one of which is shown in FIG. 8, have been formed as described above in connection with FIG. 1.

Figure 2:
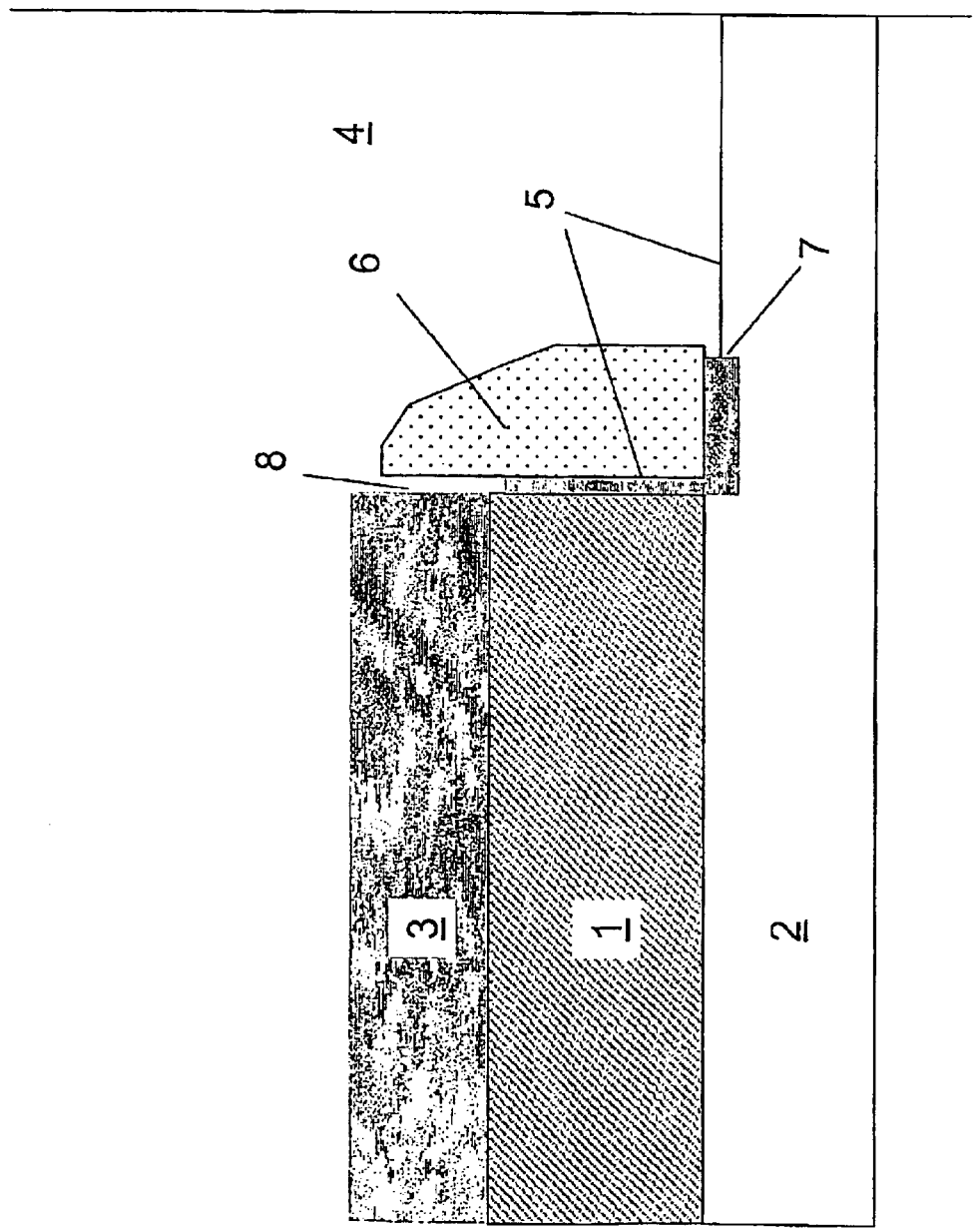
Figure 3:
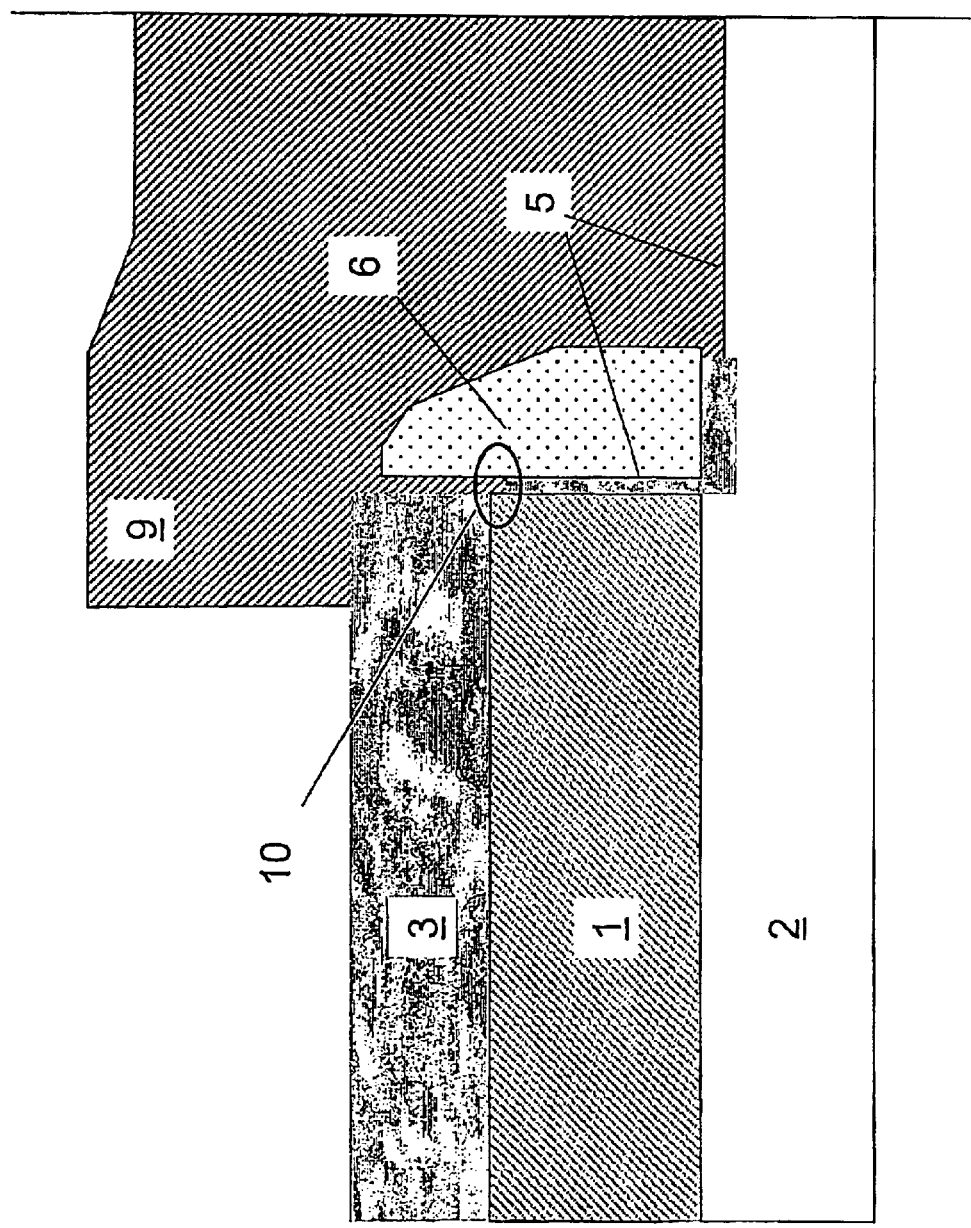

As in FIG. 2, the part of the silicon dioxide layer 5" that is not covered by the spacer 6' at the bottom of the emitter window has been etched away. Also, part of the silicon dioxide layer 5" that lies under the spacer 6" at the bottom of the emitter window will be etched away.

In the same etching step, part of the silicon dioxide layer 3' facing the emitter window is etched away as well as part of the silicon dioxide layer 5" between the base silicon layer 1' and the spacer 6".

Thus, a narrow slot 8" is etched out between the base silicon layer 1" and the spacer 6".

However, in the embodiment in FIG. 8, the etching-out of the slot 8" will be stopped by the silicon nitride layer 12. Consequently, the slot 8" will extend just down to the silicon nitride layer 12.

When, after cleaning of exposed silicon surfaces, which includes removal of native silicon dioxide by exposure to hydrofluoric acid in a bath or vapor, emitter silicon 9" is deposited into the emitter window, the emitter silicon 9" in the slot 8" will not come into direct contact with the base silicon layer 1" but will be blocked by the silicon nitride layer 12 as indicated within an encircled area 10" in FIG. 8.

Thus, the silicon nitride layer 12 effectively provides a seal that isolates the base silicon 1" from the emitter silicon 9" to prevent a short-circuit in the transistor.

We claim:

1. A method in the fabrication of an emitter-base portion of a bipolar double-poly transistor, comprising the steps of
   depositing and doping a layer of base silicon on a silicon substrate,
   depositing a first layer of silicon dioxide on the base silicon layer, forming a photo mask on the first layer of silicon dioxide,
   etching an emitter window through the first layer of silicon dioxide and the base silicon layer by using said photo mask,
   forming a notch in the emitter window wall by means of etching part of the first layer of silicon dioxide in the interface between the first layer of silicon dioxide and the layer of base silicon while the photo mask is till present to prevent upper portions of the first layer of silicon dioxide from being etched,
   removing the photo mask,
   forming a second layer of silicon dioxide in the emitter window and in the notch,
   forming silicon nitride spacers on the second layer of silicon dioxide in the emitter window by deposition of silicon nitride and reactive ion etching, whereupon the notch is filed by the silicon nitride,
   removing the second layer of silicon dioxide from the bottom of the emitter window, and
   depositing emitter silicon in the emitter window and on top of and in contact with said first layer of silicon dioxide, wherein said steps of forming a notch and depositing silicon nitride create a silicon nitride seal isolating the base silicon from the emitter silicon.

2. The method according to claim 1, comprising the step of forming the notch by exposing at least the emitter window wall to anhydrous hydrofluoric vapor.

3. A bipolar double-poly transistor comprising
   a layer of base silicon on a silicon substrate,
   a first layer of silicon dioxide on the base silicon layer,
   an emitter window extending through the first layer of silicon dioxide and the base silicon layer,
   a second layer of silicon dioxide in the emitter window,
   silicon nitride spacers on the second layer of silicon dioxide in the emitter window,
   emitter silicon in the emitter window, and
   an isolating nitride seal provided to separate the base silicon from the emitter silicon for preventing short-circuiting between the base silicon and the emitter silicon in the transistor, wherein
   said isolating nitride seal comprises a notch in the emitter window wall in the interface between the first layer of silicon dioxide and the layer of base silicon, and silicon nitride filling out the notch; and
   said emitter silicon is present on top of, and in contact with, said first layer of silicon dioxide.

4. The method according to claim 1, wherein the notch is formed in the emitter window wall to have a height, which is less than the thickness of the first layer of silicon dioxide.

5. The transistor according to claim 3, wherein the notch formed in the emitter window wall has a height, which is less than the thickness of the first layer of silicon dioxide.

* * * * *